United States Patent [19]

Rice et al.

[11] Patent Number: 4,888,574

[45] Date of Patent: Dec. 19, 1989

[54] CIRCUIT BOARD MATERIAL AND METHOD OF MAKING

[75] Inventors: James M. Rice, Santa Monica; Bruce P. Mahler, Thousand Oaks, both of Calif.

[73] Assignee: 501 Ohmega Electronics, Inc., Culver City, Calif.

[21] Appl. No.: 173,944

[22] Filed: Mar. 28, 1988

Related U.S. Application Data

[60] Continuation of Ser. No. 822,371, Mar. 17, 1986, abandoned, which is a division of Ser. No. 738,835, May 29, 1985, Pat. No. 4,808,967.

[51] Int. Cl.$^4$ ..................... H01C 1/012; C25D 3/56
[52] U.S. Cl. .................................. 338/309; 156/151; 204/27; 204/44.7; 338/308
[58] Field of Search ............ 204/32.1, 44.7, 27; 338/306, 307, 308, 309; 156/150, 151

[56] References Cited

U.S. PATENT DOCUMENTS

| | | | |
|---|---|---|---|
| 2,643,221 | 6/1953 | Brenner et al. | 204/43 |
| 3,077,442 | 2/1963 | Koretzky | 204/37 |
| 3,743,583 | 7/1973 | Castonguay | 204/27 |
| 3,808,576 | 4/1974 | Castonguay et al. | 338/309 |
| 3,857,683 | 12/1974 | Castonguay et al. | 428/608 |
| 4,554,219 | 11/1985 | Gamblin | 428/667 |

OTHER PUBLICATIONS

F. A. Lowenheim, *Electroplating*, McGraw-Hill Book Co., New York, 1978, pp. 389–400.
Max Hansen, *Constitution of Binary Alloys*, McGraw-Hill Book Co., New York, 1958, pp. 207–208.
Abner Brenner, *Electrodeposition of Alloys*, Volume II, Academic Press, New York, 1963, pp. 457–461.

*Primary Examiner*—John F. Niebling
*Assistant Examiner*—William T. Leader
*Attorney, Agent, or Firm*—Spensley Horn Jubas & Lubitz

[57] ABSTRACT

An improved multilayered circuit board material and process for making that material is disclosed. The material includes an insulating material support layer, an electrical resistance material layer adhering to the support layer, and a conductive material layer adhering to the resistance material layer and in intimate contact with that layer. The electrical resistance material layer comprises electroplated nickel-phosphorous containing up to about 30% by weight of phosphorous; however, no appreciable amounts of sulfur are present within at least the top about ten atomic layers of the electrical resistance material layer. As a result, the stability of the electrical resistance material layer is significantly increased. In addition, the electroplating bath does not contain chloride salts resulting in decreased pitting in the electrical resistance material layer.

17 Claims, 2 Drawing Sheets

CIRCUIT BOARD MATERIAL AND METHOD OF MAKING

This is a continuation of application Ser. No. 0/822,371 filed on Mar. 17, 1986, now abandoned, which is a division of application Serial No. 738,835, filed on May 29, 1985, now U.S. Pat. No. 4,808,967.

BACKGROUND OF INVENTION

1. Field of the Invention.

This invention relates to the field of circuit board material manufacture, and in particular, to electroplated, multilayered printed circuit board materials.

2. Prior Art.

In U.S. Pat. No. 3,808,576, assigned to Ohmega Technologies, Inc., a multilayered printed circuit board material is disclosed containing an insulating material support layer having joined thereto an electrical resistance material layer which is in intimate contact with a conductive material layer. The electrical resistance material layer disclosed in that patent is electroplated nickel, and contains up to about 30 percent by weight of phosphorous. The electroplating bath for this layer as disclosed therein is a modification of the standard Watts bath wherein boric acid is replaced by mixtures of phosphorous acid and phosphoric acid. The plating bath also includes nickel sulfate and nickel chloride. Nickel sulfate and nickel chloride have been used in the plating industry for years as traditional nickel salts; with nickel sulfate being one of the most available and least expensive nickel salts and nickel chloride functioning as an anode corroder.

While use of the plating bath disclosed in the above referenced patent has produced a useful product, the resulting nickel-phosphorus electrical resistance material layer has several problems including excessive porosity and poor peel strength. In addition, it is desirable to enhance other electrical properties of the electrical resistance material layer.

SUMMARY OF THE INVENTION

The present invention relates to a printed circuit board material comprising a substrate layer, an electrical resistance material layer on the substrate, and a conductive material layer in intimate contact with the electrical resistance material layer. The electrical resistance material layer comprises electroplated nickel with up to 30 percent by weight of phosphorus; however, there is no sulfur in the top atomic layers of the electrical resistance material layer. Moreover, sulfate and chloride salts are not used in the plating bath. As a result, the circuit board material of the present invention shows significant improvement and stability, e.g., peel strength, resistance change after time, temperature coefficient of resistance, current noise and decreased pitting, compared with prior art circuit board materials. The improvements result from the electro deposition of the electrical resistance material layer from a plating bath substantially free of sulfate and chloride salts.

DESCRIPTION OF PREFERRED EMBODIMENTS

The following description is of the best presently contemplated mode of carrying out the invention. This description is made for the purpose of illustrating the general principles of the invention and is not to be taken in a limiting sense. The scope of the invention is best determined by reference to the appended claims.

The present invention is directed to a multilayered printed circuit board material and a method for producing that material. In general the circuit board has three layers, a substrate, an electrical resistance material layer and a conductive material layer. While three layers are typical, more than three layers are within the scope of the present invention.

The focus of the present invention is on improving the quality of the circuit board material, and in particular, the electrical resistance material layer. It has been found that by altering the constituents of the electrical resistance material layer plating bath significant improvements in the stability and porosity of the electrical resistance material layer are observed.

Figure 4:
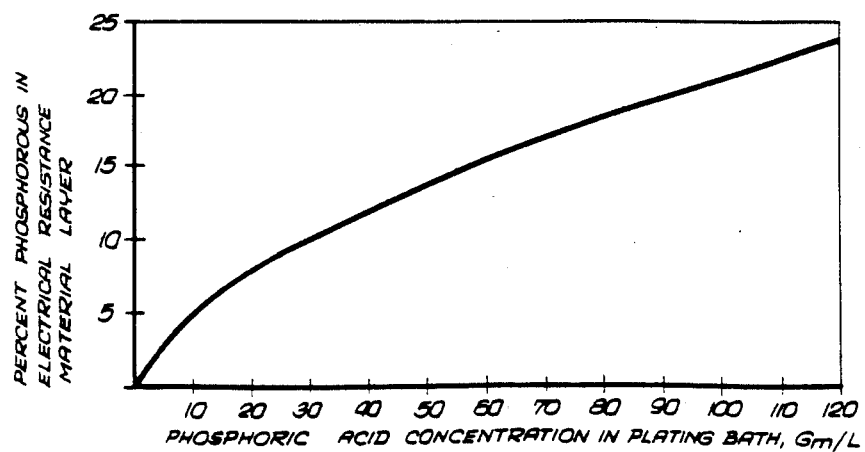
FIG. 4 is a graph of percent by weight phosphorus in the electrical resistance material layer of the present invention versus phosphoric acid concentration in the plating bath.

A. The Electrical Resistance Material Layer Plating Bath. The key to the improvements in the electrical resistance material layer of the present invention is the lack of sulfate salts, and preferably also chloride salts, in the plating bath. For example, a nickel-phosphorous resistance material layer having up to 30% phosphorous can be electroplated on a substrate using a bath comprising, and preferably consisting essentially of, the following exemplary constituents: nickel carbonate, phosphoric acid, and phosphorous acid. Unlike the plating baths disclosed in U.S. Pat. No. 3,808,576, the bath of the present invention does not include nickel sulfate and nickel chloride. The phosphoric acid and phosphorous acid content in the plating bath can be adjusted, or even reduced to zero, to provide from 0 to 30 percent by weight of phosphorous in the electrical resistance material layer. The more typical composition; however, is from 8 to 30 percent by weight of phosphorous. See FIG. 4 and the discussion below. As discussed further below, the lack of chloride salts and sulfate salts in the plating bath results in the circuit board material showing increased stability and decreased porosity.

B. The Process. After plating the nickelphosphorous electrical resistance material layer on a conductive material substrate, e.g., copper foil, the electrical resistance material layer is given an oxidizing treatment such as that previously described in U.S. Pat. No. 3,808,576. Next, the conductiveresistive material is laminated to an insulating substrate with the oxidized nickel surface of the resistive material in intimate contact with the insulating substrate.

Following lamination, the copper surface is coated with photoresist which is then exposed through a photographic negative containing the combined conductor and resistor patterns. The exposed photoresist is developed leaving the composite resistor-conductor patter protected. The exposed copper is etched with a conventional etchant. The panel is rinsed in water and immersed in a selective etchant until the exposed resistor layer is removed. The remaining photoresist is stripped away and the panel is again coated with photoresist and exposed to protect the conductor pattern. The exposed photoresist is developed and the panel is etched in chromic acid until the bare copper is removed. The panel is rinsed, the remaining photoresist stripped away, again rinsed and dried. At this point, the conductive and resistive elements are defined and in electrical contact with each other.

C. The Electrical Resistance Material Layer Plating Bath Examples. The following examples are presented solely to illustrate the invention and should not be regarded as limiting in any way. The plating cell was the same in all of the following examples. Mold agitation was provided by a recirculating pump to maintain uniform bath temperature. The cathode was electrodeposited one ounce copper foil which was plated on the matte side. The shiny or drum side of the foil was masked by a rubber coated backing fixture. The cathode and fixture were in equilibrium with the bath temperature. The cathode size was 11.5 inch×14.25 inch. The anode was platinum clad columbian with an anode to cathode ratio of 1.3:1.

EXAMPLE 1

(Reference Bath having the same components as that shown in U.S. Pat. No. 3,808,576 above, also see U.S. Pat. No. 2,643,221 to Brenner)

|  | g/l | M/L |
| --- | --- | --- |
| $NiSO_4.6H_2O$ | 150 | 0.57 |
| $NiCl_2.6H_2O$ | 45 | 0.19 |
| $NiCO_3$ | 15 | 0.125 |
| $H_3PO_4$ | 49 | 0.50 |
| $H_3PO_3$ | 41 | 0.50 |
| Temperature |  | 75° C. |
| Current |  | 50 Amperes |
| Time |  | 30 Seconds |
| $R_sOhms/square$ |  | 25 |

EXAMPLE 2

In this example nickel carbonate and phosphorous acid were reacted to form nickel acid phosphite:

| $NiCO_3 + 2H_3PO_3 = Ni(H_2PO_3)_2 + CO_2 + H_2O$ | | |
| --- | --- | --- |
|  | g/l | M/L |
| $NiCO_3$ | 106 | 1.0 |
| $H_3PO_3$ | 164 | 2.0 |
| Temperature |  | 70° C. |
| Current |  | 50 Amperes |
| Time |  | 30 Seconds |
| $R_sOhms/square$ |  | 5 |

EXAMPLE 3

In this example, 0.25M/L of phosphoric acid was added to the bath of Example 2.

|  | g/l | M/L |
| --- | --- | --- |
| $NiCO_3$ | 106 | 1.0 |
| $H_3PO_3$ | 164 | 2.0 |
| $H_3PO_4$ | 25 | 0.25 |
| Temperature |  | 70° C. |
| Current |  | 50 Amperes |
| Time |  | 30 Seconds |
| $R_sOhms/square$ |  | 15 |

EXAMPLE 4

In this example, the phosphoric acid was increased to 0.5 M/L.

|  | g/l | M/L |
| --- | --- | --- |
| $NiCO_3$ | 106 | 1.0 |
| $H_3PO_3$ | 164 | 2.0 |
| $H_3PO_4$ | 50 | 0.5 |
| Temperature |  | 70° C. |
| Current |  | 50 Amperes |
| Time |  | 30 Seconds |
| $R_sOhms/square$ |  | 50 |

EXAMPLE 5

In this example, the temperature of the bath was increased to that of Example 1. It should be appreciated that this bath, and also the baths of Examples 2–4, are substantially, if not entirely sulfate and chloride free, i.e., the only sulfate and chloride present being contaminants in the other constituents or in the water.

|  | g/l |
| --- | --- |
| $NiCO_3$ | 106 |
| $H_3PO_3$ | 164 |
| $H_3PO_4$ | 50 |
| Temperature | 75° C. |
| Current | 50 Amperes |
| Time | 30 Seconds |
| $R_sOhms/square$ | 25 |

D. The Unexpected Properties. Several unexpected phenomena were discovered which explains the significant improvement in the quality and resultant physical and electrical properties of the nickelphosphorous electrical resistance material layer.

Figure 1:
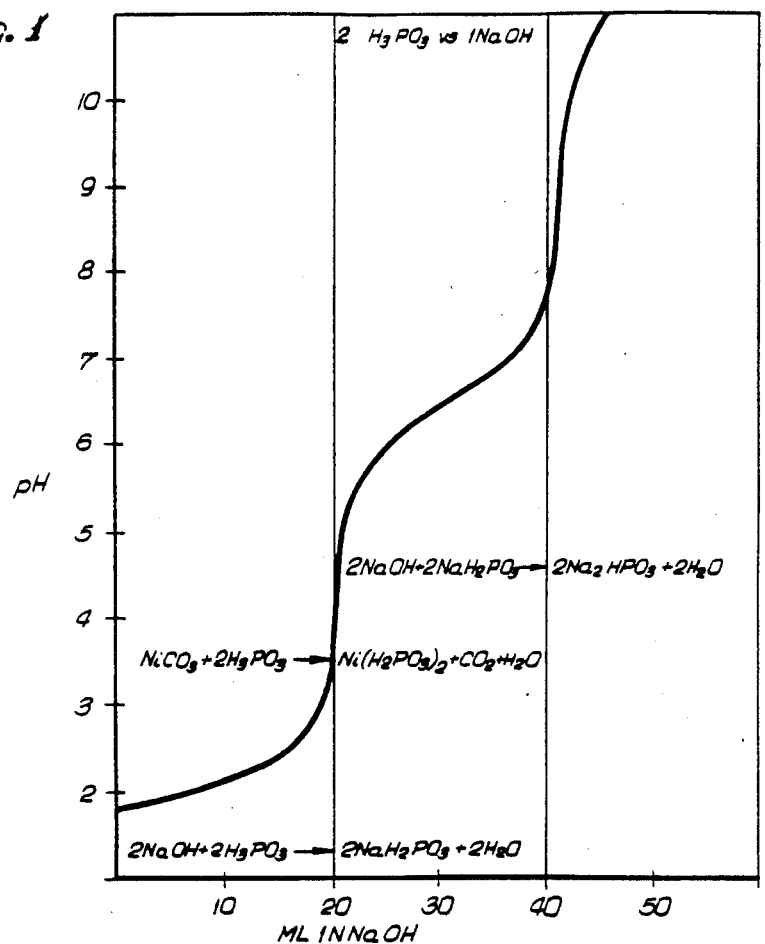
FIG. 1 is a titration curve.

First, the pH of the bath of Example 5 is about one pH unit higher than that of Example 1. This is consistent with the pH of phosphorous and phosphoric acids. The pH of Example 1 would suggest the formation of a ligand of nickel phosphite creating free hydrochloric acid. For example, if ⅛ mol of nickel carbonate reacted with ¼ mol of phosphorous acid there would remain ¼ mol of unreacted phosphrous acid. See FIG. 1. Then, apparently, the nickel chloride reacts with the free phosphorous acid:

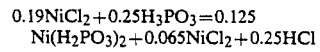

The calculated pH of 0.25M HCl is $$\log \frac{1}{2.5 \times 10 - 1} = \log \frac{10}{2.5}.$$

Figure 2:
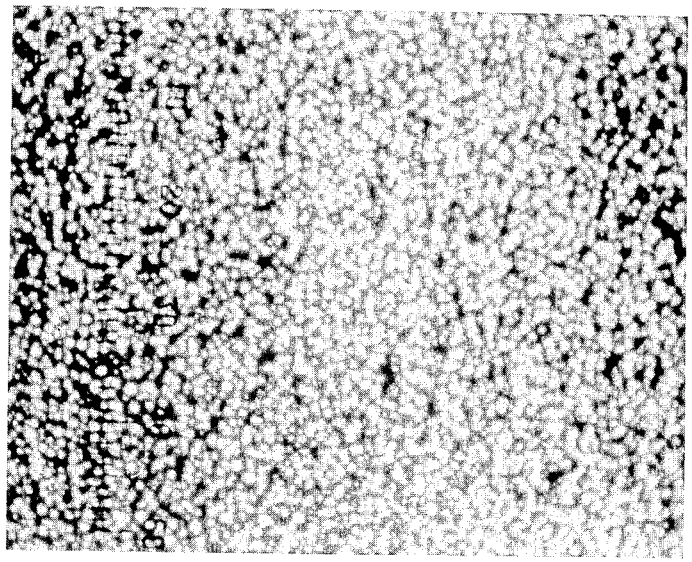
FIG. 2 is a photograph of the surface of an electrical resistance material layer prepared according to a prior art process.

The log of 2.5 is 0.398 or 0.4 and the pH is 1.0−0.4=0.6, which could explain the unusually low pH of the Reference Bath (Example 1) and the voids or pits as seen in the photograph (magnification 400×) of the surface of an electrical resistance material layer prepared according to the Reference Bath and shown in FIG. 2. Comparing FIG. 2 with the photograph shown in FIG. 3, which is a photograph (magnification 400×) of the surface of a resistance material layer prepared according to Example 5 of the present invention, one can see the complete lack of pitting. In fact the electrical resistance material layer shows a smooth continuous surface as opposed to the pitted surface shown in FIG. 2. It is believed that this lack of pitting results from the lack of chloride ions in the plating bath. It should be understood then that the present invention contemplates a plating bath lacking in addition to chloride salts, other materials which cause pitting problems.

Second, with reference to Tables 1 and 2, while a bulk analysis by EDX (Energy Dispersive X-Ray) shows the electrical resistance material layers prepared according to Examples 1 and 5 to be basically phosphorous equivalent (13% and 14% P, respectively), analysis of the resistance material layers by XPS (X-Ray Photoelectron Spectroscopy) revealed the inclusion of 2.7 atomic percent of sulfur in the resistance material layer prepared according to Example 1 and the total absence of sulfur in the resistance material layer prepared according to Example 5. It is believed that sulfur is deleterious in nickel causing embrittlement, and may be the reason for the increased peel strength of the resistance material layer of the present invention. Thus while the present invention contemplates an electrical resistance material layer having no sulfur within at least the top, e.g., about ten, atomic layers of the electrical resistance material layer, less than about 2% by weight and preferably the total absence of sulfur in the electrical resistance material layer is also within the scope of the present invention.

TABLE 1

| EDX Analysis Example 1 Reference Bath | Example 5 Bath |
|---|---|
| Ni 86.1% | 87.1% |
| P 13.9 | 12.9 |

TABLE 2

| XPS Analysis Example 1 Reference Bath | Example 5 Bath |
|---|---|
| S 2.72 | 0 |

The bath of Example 5 has been operated in the range of $0.25Ni/0.50PO_3$ to $1.25Ni/2.50PO_3$. The phosphorous content of the electrical resistance material layer appears to be a function of the phosphoric acid concentration in the plating bath. See FIG. 4. In the Example 2 bath (no phosphoric acid), the phosphorous content of the electrical resistance material layer was negligible; whereas, in the Example 3 bath, the phosphorous content was about 8.5%. It was found after plating that there was 0.2M/L of hypophosphite in the bath. Thus there appears to be an initial disproportionation of orthophosphite to orthophosphate and hypophosphite with a resulting equilibrium mixture of the various oxidation states in the bath.

While the bath itself represents a significant and unexpected improvement in the state-of-the-art, the unexpected, surprising results found were also those of the physical and electrical characteristics of the electrical resistance material layer. Specifically, the following properties (Table 3) were evaluated for circuit boards produced from the Example 1 reference bath and the Example 5 bath of the present invention, with the conductive and insulating layers being the same. The improved characteristics are the result of the improved quality of the nickel-phosphorous electrical resistance material layer.

TABLE 3

| | Example 1 Reference Bath | Example 5 Bath |
|---|---|---|
| Peel Strength, lbs./inch | 6 | 9 |
| Resistance Change After 1000 Hrs at 70° C., 5W/in² Load | 3% | 0.2% |
| Temperature Coefficient of Resistance, −65° C. to 125° C. | −50 ppm/°C. | −10 ppm/°C. |
| Current Noise, Microvolt/volt | .05 | <.02 |
| Resistor Value, 10" × 12" Sheet Ohms Per Square | 25.0 ± 1.0 | 25.0 ± 0.25 |

Figure 3:
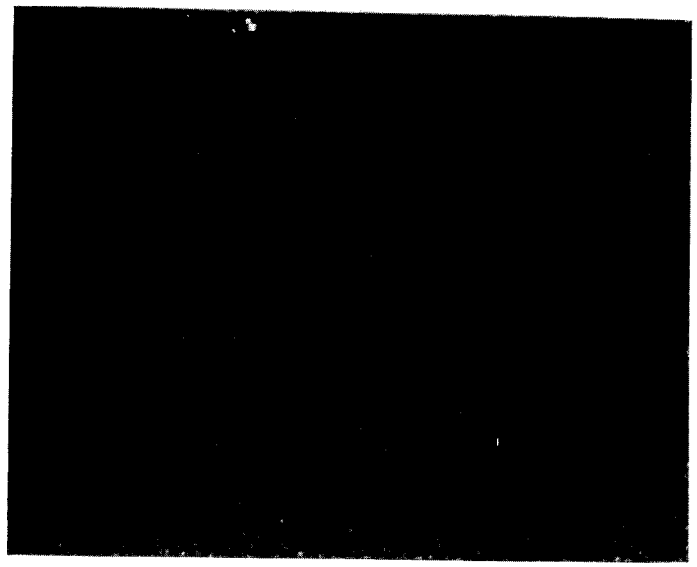
FIG. 3 is a photograph of the surface of an electrical resistance material layer prepared according to the process of the the present invention.

And, as previously discussed, the photomicrographs shown in FIGS. 2 and 3 (400×, transmitted light, ½ sec. exposure, 4 amps.) clearly show the dramatic improvement of porosity quality resulting from the plating bath of the present invention; the resistance material layer formed from the Reference Bath being relatively more porous; that of the present invention at this magnification being smooth and continuous.

The insulating substrate layer can be a reinforced organic resin, plastic or any of those discussed in U.S. Pat. No. 3,808,576. Moreover it has been found that even more significant improvements in peel strength are observed if a high topographical conducting substrate is used. For example, a high topographical copper foil conductive layer yields a peel strength of about 12.

It should be appreciated to those of skill in the art that the present invention is not limited to the specific examples set forth above, and that many modifications and variations are within the scope of the present invention. In particular, the present invention is intended to cover a transistion metal-phosphorus electrical resistance material layer having up to about 30% by weight phosphorus, with the resistance material layer being sulfur and chloride free, and being relatively non-porous. The bath in general can contain nickel carbonate or its equivalent, phosphorus acid and phosphoric acid, with the amount of phosphorus and phosphoric acid adjustable to vary the amount of phosphorus in the electrical resistance material layer.

We claim:

1. A method of electroplating a circuit board substrate with nickel-phosphorous, the method comprising the steps of:
   (a) cleaning the substrate; and
   (b) electroplating the substrate in a bath consisting essentially of an aqueous solution of a nickel ion source, $H_3PO_3$ and $H_3PO_4$, wherein the bath is substantially sulfate and chloride free.

2. The method according to claim 1 wherein the concentration of Ni ions to $PO_3$ ions in the bath ranges from 0.25/0.50 to 1.25/2.50.

3. The method of electroplating a substrate according to claim 1 including the further step of forming the nickel ions in the bath by dissolving nickel carbonate in the bath.

4. A method according to claim 1 wherein the bath consists essentially of a solution of nickel carbonate, $H_3PO_3$ and $H_3PO_4$.

5. The electroplated substrate according to claim 1, wherein the resistance change after 1000 hours at 70° C. is 0.2%, wherein the temperature coefficient of resistance from −65° C. to 125° C. is −10 ppm/° C., and wherein the current noise is less than 0.02 microvolts/volt.

6. An electroplating bath used for electroplating a nickel-phosphorous resistance layer on a printed circuit board material stock substrate, the bath consisting essentially of a nickel ion source, phosphoric acid and phosphorous acid, and wherein the bath is substantially sulfate and chloride free.

7. The electroplating bath according to claim 6 wherein the nickel ions are formed by dissolving nickel carbonate in the bath, and wherein the bath is aqueous.

8. A substantially sulfate and chloride free electroplating bath used for electroplating a nickel-phosphorous resistance layer on a substrate, the bath consisting essentially of an aqueous solution of 1M nickel ion source, 2M phosphorous acid and 0.5M phosphoric acid.

9. A process for electroplating an electrical resistance material layer composition on a substrate, the process including the step of electroplating the substrate in a substantially sulfate and chloride free bath consisting essentially of 1 Molar nickel carbonate, 2 Molar phosphorous acid, and 0.5 Molar phosphoric acid, wherein the bath temperature ranges from 70° C. to 75° C., the time of electroplating is 30 seconds and the RsOhms/square ranges from 25 to 50.

10. The process according to claim 9 wherein the bath temperature is 70° C. and the RsOhms/square is 50.

11. The process according to claim 9 wherein the bath temperature is 75° C. and the RsOhms/square is 25.

12. The substrate and electroplated electrical resistance material layer formed thereon according to the process of claim 11.

13. The substrate and electrical resistance material layer formed thereon according to the process of claim 9.

14. A method for forming a printed circuit board material having a nickel-phosphorous electrical resistance material layer in contact with a conductive material and an insulating substrate, the method comprising:
forming an electroplating bath consisting essentially of a nickel ion source, phosphoric acid and phosphorous acid, the bath being substantially chloride and sulfate free;
electroplating to form the electrical resistance material layer on the conductive material in the electroplating bath; and
adhering the resultant electroplated conductive material to an insulating substrate such that the electrical resistance material layer is in operative contact with the insulating substrate.

15. The printed circuit board material product formed according to the method of claim 14.

16. A method of electroplating a nickel-phosphorous composition on a circuit board substrate including the following steps:
(a) cleaning the substrate;
(b) forming an electroplating bath consisting essentially of $H_3PO_4$, $H_3PO_3$, and a nickel ion source, and wherein the bath is essentially free of sulfate and chloride ions; and
(c) electroplating the composition onto the substrate in the bath.

17. A method according to claim 16 wherein the nickel ion source is nickel carbonate.

* * * * *